US011987677B2

(12) United States Patent
Ye et al.

(10) Patent No.: US 11,987,677 B2
(45) Date of Patent: *May 21, 2024

(54) PVDF THIN FILM HAVING A BIMODAL MOLECULAR WEIGHT AND HIGH PIEZOELECTRIC RESPONSE

(71) Applicant: META PLATFORMS TECHNOLOGIES, LLC

(72) Inventors: Sheng Ye, Redmond, WA (US); Hao Mei, Redmond, WA (US); Cody Wayne Weyhrich, Phoenix, AZ (US); Arman Boromand, Redmond, WA (US); Andrew John Ouderkirk, Redmond, WA (US); Christopher Yuan Ting Liao, Seattle, WA (US); Emma Rae Mullen, Seattle, WA (US); Christopher Stipe, Woodinville, WA (US); Nagi Hosni Elabbasi, Southborough, MA (US); Rui Jian, Fremont, CA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 187 days.

This patent is subject to a terminal disclaimer.

(21) Appl. No.: 17/559,655

(22) Filed: Dec. 22, 2021

(65) Prior Publication Data
US 2022/0348729 A1    Nov. 3, 2022

Related U.S. Application Data

(60) Provisional application No. 63/181,978, filed on Apr. 30, 2021, provisional application No. 63/254,449, filed on Oct. 11, 2021.

(51) Int. Cl.
  *C08L 27/16*   (2006.01)
  *C08J 5/18*    (2006.01)
  (Continued)

(52) U.S. Cl.
  CPC ............. *C08J 5/18* (2013.01); *C08L 27/16* (2013.01); *C08J 2427/16* (2013.01); *C08L 27/04* (2013.01);
  (Continued)

(58) Field of Classification Search
  CPC .......... C08L 27/16; C08L 27/14; C08L 27/12; C08L 27/04; C08F 14/22; C08F 14/20; C08F 14/24; C08F 14/18; C08F 14/02
  See application file for complete search history.

(56) References Cited

U.S. PATENT DOCUMENTS 4,241,128 A * 12/1980 Wang .................. C08J 5/18
                                                    264/435
4,298,719 A * 11/1981 Mizuno ................ H01G 7/023
                                                    428/910
(Continued)

FOREIGN PATENT DOCUMENTS

CN         1805165 A  *  7/2006  ............. H01L 41/22
CN       101578717 A  * 11/2009  ............. H01L 41/22
(Continued)

OTHER PUBLICATIONS

Baur, C.; DiMaio, J.R.; McAlister, E.; Hossini, R.; Wagener, E.; Ballato, J.; Priya, S.; Ballato, A.; Smith Jr., D.W. J. Applied Physics 2012, 112, 124104. (Year: 2012).*
(Continued)

*Primary Examiner* — Rip A Lee
(74) *Attorney, Agent, or Firm* — Greenberg Traurig, LLP

(57) ABSTRACT

A mechanically and piezoelectrically anisotropic polymer thin film is formed from a crystallizable polymer and an additive configured to interact with the polymer to facilitate chain alignment and, in some examples, create a higher crystalline content within the polymer thin film. The polymer thin film and its method of manufacture may be char-
(Continued)

acterized by a bimodal molecular weight distribution where the molecular weight of the additive may be less than approximately 5% of the molecular weight of the crystallizable polymer. Example polymers may include vinylidene fluoride, trifluoroethylene, chlorotrifluoroethylene, hexafluoropropylene, and vinyl fluoride. Example additives may occupy up to approximately 60 wt. % of the polymer thin film. The polymer thin film may be characterized by a piezoelectric coefficient ($d_{31}$) of at least approximately 5 pC/N or an electromechanical coupling factor ($k_{31}$) of at least approximately 0.1.

19 Claims, 4 Drawing Sheets

(51) Int. Cl.
  *C08L 27/14* (2006.01)
  *C08L 27/04* (2006.01)
  *C08L 27/12* (2006.01)
(52) U.S. Cl.
  CPC ............... *C08L 27/12* (2013.01); *C08L 27/14* (2013.01); *C08L 2201/10* (2013.01); *C08L 2203/16* (2013.01); *C08L 2205/02* (2013.01)

(56) References Cited

U.S. PATENT DOCUMENTS

| | | | | | |
|---|---|---|---|---|---|
| 4,668,449 | A | * | 5/1987 | Soni | H10N 30/045 |
| | | | | | 264/435 |
| 4,746,577 | A | * | 5/1988 | Pantelis | C08L 27/16 |
| | | | | | 524/99 |
| 4,946,913 | A | * | 8/1990 | Kappler | H10N 30/857 |
| | | | | | 526/87 |
| 6,689,288 | B2 | * | 2/2004 | St. Clair | C08L 27/16 |
| | | | | | 310/330 |
| 8,263,695 | B2 | * | 9/2012 | Judovits | C08K 5/19 |
| | | | | | 524/445 |
| 8,356,393 | B2 | * | 1/2013 | Moriyama | C08F 114/22 |
| | | | | | 29/25.35 |
| 9,249,246 | B2 | * | 2/2016 | Oliveira | H10N 30/045 |
| 11,319,387 | B2 | * | 5/2022 | Marrani | C08J 5/18 |
| 11,629,249 | B2 | * | 4/2023 | Marrani | C08F 214/22 |
| | | | | | 524/501 |
| 2012/0178880 | A1 | * | 7/2012 | Zhang | B32B 27/304 |
| | | | | | 525/199 |
| 2017/0233597 | A1 | * | 8/2017 | Singh | B05D 1/005 |
| | | | | | 427/553 |
| 2019/0054659 | A1 | * | 2/2019 | Tseng | B33Y 70/10 |
| 2019/0334078 | A1 | * | 10/2019 | Araujo Da Silva | H10N 30/045 |
| 2020/0123292 | A1 | * | 4/2020 | Marrani | C08F 214/222 |
| 2020/0357979 | A1 | * | 11/2020 | Kim | H10N 30/077 |
| 2022/0158075 | A1 | * | 5/2022 | Khaliq | H10N 30/045 |
| 2022/0254989 | A1 | * | 8/2022 | Ouderkirk | C08F 14/22 |
| 2022/0348730 | A1 | * | 11/2022 | Ye | B29C 55/06 |
| 2022/0350064 | A1 | * | 11/2022 | Ouderkirk | B32B 27/304 |

FOREIGN PATENT DOCUMENTS

| | | | | | |
|---|---|---|---|---|---|
| CN | 108797094 | A | * | 11/2018 | ............ D06M 11/46 |
| EP | 0093038 | A1 | * | 11/1983 | ............. H01L 41/18 |
| EP | 3327067 | A1 | * | 5/2018 | ............. H01L 41/45 |
| GB | 2184737 | A | * | 7/1987 | ............ C08F 214/18 |
| GB | 2190240 | A | * | 11/1987 | ........... H01L 41/087 |
| JP | 2016008264 | A | * | 1/2016 | ................ C08J 5/18 |
| KR | 101668104 | B1 | * | 10/2016 | ........... H01L 41/193 |
| KR | 20170058768 | A | * | 5/2017 | ........... H01L 41/193 |
| WO | WO-2020201922 | A1 | * | 10/2020 | .......... C08F 214/182 |

OTHER PUBLICATIONS

Higashihata, Y.; Yagi, T.; Sako, J. Ferroelectrics, 1986, 68:1, 63-75. (Year: 1986).*
Ting, Y.; Bunekar, N.; Sivasankar, K.; Aldori, Y.R. Coatings 2020, 10, 44/coatings 10010044. (Year: 2020).*
Gao, Zhaolin, "Characterization of Nanoporous Polyvinylidene Fluoride (PVDF) Sensors Under Tensile Loading"; dissertation May 2021. (Year: 2021).*
Kim, H.; Fernando, T.; Li, M.; Lin, Y.; Tseng, T.- L.B. J. Composite Mat. 2018, 52(2), 197-206. (Year: 2018).*
Zeng, R.; Kwok, K.W.; Chan, H.L.W.; Choy, C.L. J. Appl. Phys. 2002, 92(5), 2674-2679. (Year: 2002).*
Guo, S.; Duan, X.; Xie, M.; Aw, K.C.; Xue, Q. Micromachines 2020, 11, 1076. (Year: 2020).*
Siponkoski, T.; Nelo, M.; Palosaari, J.; Perantie, J.; Sobocinski, M.; Juuti, J.; Jantunen, H. Composites Part B Engineering, May 2015, p. 1-20. (Year: 2015).*
Baur C., et al., "Enhanced Piezoelectric Performance from Carbon Fluoropolymer Nanocomposites," Journal of Applied Physics, Dec. 15, 2012, vol. 112, No. 12, 7 pages.
International Search Report and Written Opinion for International Application No. PCT/US2022/026896, dated Aug. 3, 2022, 10 pages.
Takashima K., et al., "Piezoelectric Properties of Vinylidene Fluoride Oligomer for Use in Medical Tactile Sensor Applications," Sensors and Actuators A, May 28, 2008, vol. 144, No. 1, pp. 90-96.
Wu L., et al., "Improved Piezoelectricity of PVDF-HFP/Carbon Black Composite Films," journal of Physics D: Applied Physics, vol. 47, No. 13, Mar. 11, 2014, pp. 1-9.

* cited by examiner

PVDF THIN FILM HAVING A BIMODAL MOLECULAR WEIGHT AND HIGH PIEZOELECTRIC RESPONSE

CROSS-REFERENCE TO RELATED APPLICATIONS

This application claims the benefit of priority under 35 U.S.C. § 119(e) of U.S. Provisional Application No. 63/181,978, filed Apr. 30, 2021, and U.S. Provisional Application No. 63/254,449, filed Oct. 11, 2021, the contents of which are incorporated herein by reference in their entirety.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

Figure 1:
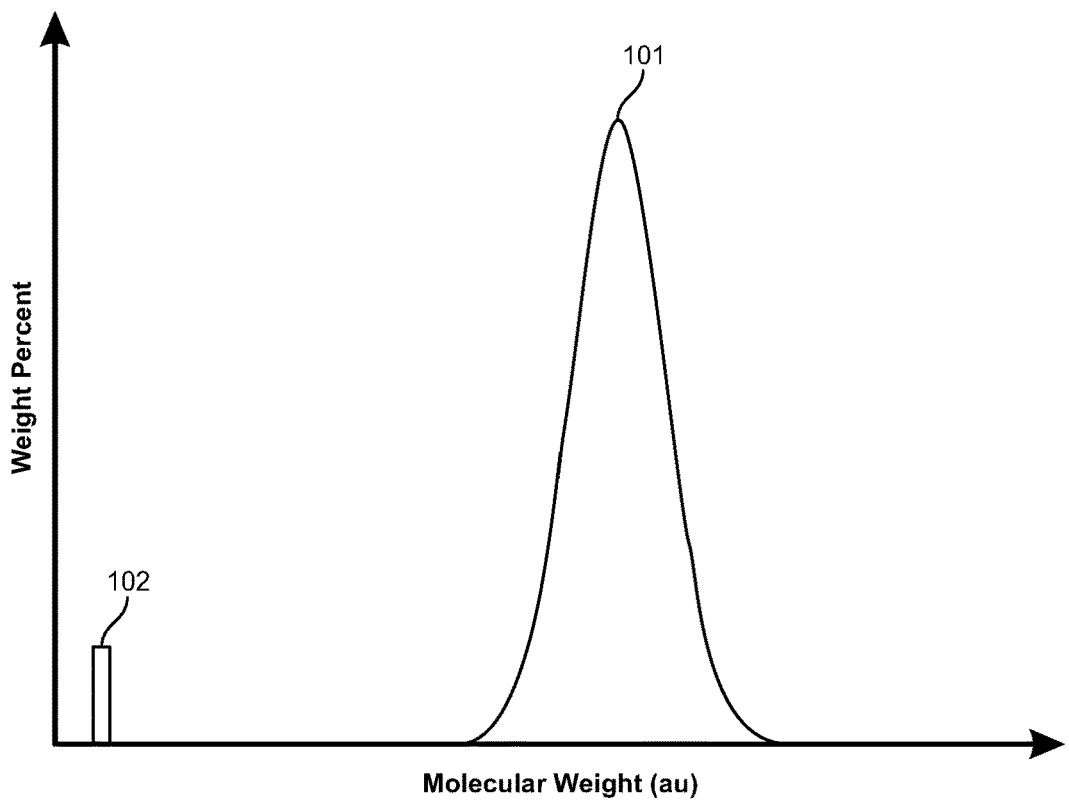
FIG. 1 is a plot showing the bimodal distribution of molecular weight among constituent elements of an example polymer thin film material according to some embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

Polymer materials may be incorporated into a variety of different optic and electro-optic systems, including active and passive optics and electroactive devices. Lightweight and conformable, one or more polymer layers may be incorporated into wearable devices such as smart glasses and are attractive candidates for emerging technologies including virtual reality/augmented reality devices where a comfortable, adjustable form factor is desired.

Virtual reality (VR) and augmented reality (AR) eyewear devices and headsets, for instance, may enable users to experience events, such as interactions with people in a computer-generated simulation of a three-dimensional world or viewing data superimposed on a real-world view. By way of example, superimposing information onto a field of view may be achieved through an optical head-mounted display (OHMD) or by using embedded wireless glasses with a transparent heads-up display (HUD) or augmented reality (AR) overlay. VR/AR eyewear devices and headsets may be used for a variety of purposes. Governments may use such devices for military training, medical professionals may use such devices to simulate surgery, and engineers may use such devices as design visualization aids. These and other applications may leverage one or more characteristics of polymer materials, including the refractive index to manipulate light, thermal conductivity to manage heat, and mechanical strength and toughness to provide light-weight structural support.

According to some embodiments, suitably oriented piezoelectric polymer thin films may be implemented as an actuatable lens substrate in an optical element such as a liquid lens. Uniaxially-oriented polyvinylidene fluoride (PVDF) thin films, for example, may be used to generate an advantageously anisotropic strain map across the field of view of a lens. However, a low piezoelectric response and/or lack of sufficient optical quality in comparative polyvinylidene fluoride (PVDF) thin films may impede their implementation as an actuatable layer.

Notwithstanding recent developments, it would be advantageous to provide optical quality, mechanically robust, and mechanically and piezoelectrically anisotropic polymer thin films that may be incorporated into various optical systems including display systems for artificial reality applications. The instant disclosure is thus directed generally to optical quality polymer thin films having a high piezoelectric response and their methods of manufacture, and more specifically to PVDF-based polymer materials having a bimodal molecular weight distribution, which may be used to form such polymer thin films.

The refractive index and piezoelectric response of a polymer thin film may be determined by its chemical composition, the chemical structure of the polymer repeat unit, its density and extent of crystallinity, as well as the alignment of the crystals and/or polymer chains. Among these factors, the crystal or polymer chain alignment may dominate. In crystalline or semi-crystalline polymer thin films, the piezoelectric response may be correlated to the degree or extent of crystal orientation, whereas the degree or extent of chain entanglement may create comparable piezoelectric response in amorphous polymer thin films.

An applied stress may be used to create a preferred alignment of crystals or polymer chains within a polymer thin film and induce a corresponding modification of the refractive index and piezoelectric response along different directions of the film. As disclosed further herein, during processing where a polymer thin film is stretched to induce a preferred alignment of crystals/polymer chains and an attendant modification of the refractive index and piezoelectric response, Applicants have shown that one approach to forming an anisotropic material is to modify the chemical composition of the polymer being stretched. Stretching may include the application of a uniaxial or biaxial stress.

In accordance with particular embodiments, Applicants have developed a polymer thin film manufacturing method for forming an optical quality PVDF-based polymer thin film having a desired piezoelectric response. Whereas in PVDF and related polymers, the total extent of crystallization as well as the alignment of crystals may be limited, e.g., during extrusion, due to polymer chain entanglement, as disclosed herein, and without wishing to be bound by theory, the extrusion or casting of a composition having a bimodal molecular weight may allow polymer chains to untangle and more uniformly align, which may lead to improvements in the optical quality of a polymer thin film as well as its piezoelectric response.

The presently disclosed anisotropic PVDF-based polymer thin films may be characterized as optical quality polymer thin films and may form, or be incorporated into, an optical element such as an actuatable layer. Such optical elements may be used in various display devices, such as virtual reality (VR) and augmented reality (AR) glasses and headsets. The efficiency of these and other optical elements may depend on the degree of optical clarity and/or piezoelectric response.

According to various embodiments, an "optical quality polymer thin film" or an "optical thin film" may, in some examples, be characterized by a transmissivity within the visible light spectrum of at least approximately 20%, e.g., 20, 30, 40, 50, 60, 70, 80, 90 or 95%, including ranges between any of the foregoing values, and less than approximately 10% bulk haze, e.g., 0, 1, 2, 4, 6, or 8% bulk haze, including ranges between any of the foregoing values.

As used herein, the term "approximately" in reference to a particular numeric value or range of values may, in certain embodiments, mean and include the stated value as well as all values within 10% of the stated value. Thus, by way of example, reference to the numeric value "50" as "approximately 50" may, in certain embodiments, include values equal to 50±5, i.e., values within the range 45 to 55.

In further embodiments, an optical quality PVDF-based polymer thin film may be incorporated into a multilayer structure, such as the "A" layer in an ABAB multilayer. Further multilayer architectures may include AB, ABA, ABAB, or ABC configurations. Each B layer (and each C layer, if provided) may include a further polymer composition, such as polyethylene. According to some embodiments, the B (and C) layer(s) may be electrically conductive and may include, for example, indium tin oxide (ITO) or poly(3,4-ethylenedioxythiophene).

In a multilayer architecture, each PVDF-family layer may have a thickness ranging from approximately 100 nm to approximately 5 mm, e.g., 100, 200, 500, 1000, 2000, 5000, 10000, 20000, 50000, 100000, 200000, 500000, 1000000, 2000000, or 5000000 nm, including ranges between any of the foregoing values. A multilayer stack may include two or more such layers. In some embodiments, a density of a PVDF layer or thin film may range from approximately 1.7 g/cm$^3$ to approximately 1.9 g/cm$^3$, e.g., 1.7, 1.75, 1.8, 1.85, or 1.9 g/cm$^3$, including ranges between any of the foregoing values.

According to some embodiments, the areal dimensions (i.e., length and width) of an anisotropic PVDF-family polymer thin film may independently range from approximately 5 cm to approximately 50 cm or more, e.g., 5, 10, 20, 30, 40, or 50 cm, including ranges between any of the foregoing values. Example anisotropic polymer thin films may have areal dimensions of approximately 5 cm×5 cm, 10 cm×10 cm, 20 cm×20 cm, 50 cm×50 cm, 5 cm×10 cm, 10 cm×20 cm, 10 cm×50 cm, etc.

In accordance with various embodiments, an anisotropic PVDF-based polymer thin film may be formed by applying a desired stress state to a crystallizable polymer thin film. A polymer composition capable of crystallizing may be formed into a single layer using appropriate extrusion and casting operations well known to those skilled in the art. For example, a vinylidene fluoride-containing composition may be extruded and oriented as a single layer to form a mechanically and piezoelectrically anisotropic thin film. According to further embodiments, a crystallizable polymer may be co-extruded with other polymer materials that are either crystallizable, or those that remain amorphous after orientation, to form a multilayer structure.

As used herein, the terms "polymer thin film" and "polymer layer" may be used interchangeably. Furthermore, reference to a "polymer thin film" or a "polymer layer" may include reference to a "multilayer polymer thin film" and the like, unless the context clearly indicates otherwise.

In accordance with various embodiments, a polymer composition used to form an anisotropic polymer thin film may include a crystallizable polymer and a low molecular weight additive. Without wishing to be bound by theory, one or more low molecular weight additives may interact with high molecular weight polymers throughout extrusion and stretch processes to facilitate less chain entanglement and better chain alignment and, in some examples, create a higher crystalline content within the polymer thin film. That is, a composition having a bimodal molecular weight distribution may be extruded to form a thin film, which may be stretched to induce mechanical and piezoelectric anisotropy through crystal and/or chain realignment. Stretching may include the application of a uniaxial stress or a biaxial stress. In some embodiments, the application of an in-plane biaxial stress may be performed simultaneously or sequentially. In some embodiments, the low molecular weight additive may beneficially decrease the draw temperature of the polymer composition during extrusion. In some embodiments, the molecular weight of the low molecular weight additive may be less than the molecular weight of the crystallizable polymer.

A method of forming an anisotropic polymer thin film (e.g., an optical quality polymer thin film) may include pre-mixing and/or co-extruding a crystallizable polymer and an additive having a low molecular weight. The mixture having a bimodal molecular weight distribution may be formed into a single layer using suitable extrusion and casting operations. For instance, the mixture may be extruded and oriented as a single mechanically and piezoelectrically anisotropic optical quality polymer thin film. According to further embodiments, the mixture may be co-extruded with a second polymer or other material to form a multilayer optical quality polymer thin film. The second material may include a further polymer composition, such as polyethylene, or may be electrically conductive and may include, for example, indium tin oxide (ITO) or poly(3,4-ethylenedioxythiophene). Such a multilayer may be optically clear, and mechanically and piezoelectrically anisotropic.

In some embodiments, a polymer thin film having a bimodal molecular weight distribution may be stretched to a larger stretch ratio than a comparative polymer thin film (i.e., lacking a low molecular weight additive). In some examples, a stretch ratio may be greater than 4, e.g., 5, 10, 20, 40, or more. The act of stretching may include a single stretching step or plural (i.e., successive) stretching steps where one or more of a stretching temperature and a strain rate may be independently controlled.

In example methods, the polymer thin film may be heated during stretching to a temperature of from approximately 60° C. to approximately 180° C. and stretched at a strain rate of from approximately 0.1%/sec to 300%/sec. Moreover, one or both of the temperature and the strain rate may be held constant or varied during the act of stretching. For instance, a polymer thin film may be stretched at a first temperature and a first strain rate (e.g., 130° C. and 50%/sec) to achieve a first stretch ratio. Subsequently, the temperature of the polymer thin film may be increased, and the strain rate may be decreased, to a second temperature and a second strain rate (e.g., 165° C. and 5%/sec) to achieve a second stretch ratio.

Such a stretched polymer thin film may exhibit higher crystallinity and a higher modulus. By way of example, an oriented polymer thin film having a bimodal molecular weight distribution may have a modulus greater than approximately 2 GPa, e.g., 3 GPa, 5 GPa, 10 GPa, 15 GPa or 20 GPa, including ranges between any of the foregoing values, and a piezoelectric coefficient ($d_{31}$) greater than approximately 5 pC/N. High piezoelectric performance may be associated with the creation and alignment of beta phase crystals in PVDF-family polymers.

Further to the foregoing, an electromechanical coupling factor $k_{ij}$ may indicate the effectiveness with which a piezoelectric material can convert electrical energy into mechanical energy, or vice versa. For a polymer thin film, the electromechanical coupling factor $k_{31}$ may be expressed as $$k_{31} = \frac{d_{31}}{\sqrt{e_{33} * s_{31}}},$$

where $d_{31}$ is the piezoelectric strain coefficient, $e_{33}$ is the dielectric permittivity in the thickness direction, and $s_{31}$ is the compliance in the machine direction. Higher values of $k_{31}$ may be achieved by disentangling polymer chains prior to or during stretching and promoting dipole moment alignment within a crystalline phase. In some embodiments, a polymer thin film may be characterized by an electromechanical coupling factor $k_{31}$ of at least approximately 0.1, e.g., 0.1, 0.2, 0.3, or more, including ranges between any of the foregoing values.

Example crystallizable polymers may include moieties such as vinylidene fluoride (VDF), trifluoroethylene (TrFE), chlorotrifluoroethylene (CTFE), hexafluoropropylene (HFP), and vinyl fluoride (VF). As used herein, one or more of the foregoing "PVDF-family" moieties may be combined with a low molecular weight additive to form an anisotropic polymer thin film. The PVDF-family component of such a resulting polymer may have a molecular weight ("high molecular weight") of at least 100,000 g/mol, e.g., at least 100,000 g/mol, at least 150,000 g/mol, at least 200,000 g/mol, at least 250,000 g/mol, at least 300,000 g/mol, at least 350,000 g/mol, at least 400,000 g/mol, at least 450,000 g/mol, or at least 500,000 g/mol, including ranges between any of the foregoing values. Reference herein to a PVDF-film includes reference to any PVDF-family member-containing polymer thin film unless the context clearly indicates otherwise. Use herein of the term "molecular weight" may, in some examples, refer to a weight average molecular weight.

The low molecular weight additive may have a molecular weight of less than approximately 200,000 g/mol, e.g., less than approximately 200,000 g/mol, less than approximately 100,000 g/mol, less than approximately 50,000 g/mol, less than approximately 25,000 g/mol, less than approximately 10,000 g/mol, less than approximately 5000 g/mol, less than approximately 2000 g/mol, less than approximately 1000 g/mol, less than approximately 500 g/mol, less than approximately 200 g/mol, or less than approximately 100 g/mol, including ranges between any of the foregoing values.

According to a particular example, the crystalline polymer may have a molecular weight of at least approximately 100,000 g/mol and the additive may have a molecular weight of less than approximately 25,000 g/mol. According to a further example, the crystalline polymer may have a molecular weight of at least approximately 300,000 g/mol and the additive may have a molecular weight of less than approximately 200,000 g/mol.

According to some embodiments, the crystalline content of an anisotropic polymer thin film may include crystals of poly(vinylidene fluoride), poly(trifluoroethylene), poly (chlorotrifluoroethylene), poly(hexafluoropropylene), and/or poly(vinyl fluoride), for example, although further crystalline polymer materials are contemplated, where a crystalline phase in a "crystalline" or "semi-crystalline" polymer thin film may, in some examples, constitute at least approximately 30% of the polymer thin film.

Example low molecular weight additives may include oligomers and polymers of vinylidene fluoride (VDF), trifluoroethylene (TrFE), chlorotrifluoroethylene (CTFE), hexafluoropropylene (HFP), and vinyl fluoride (VF), as well as homopolymers, co-polymers, tri-polymers, derivatives, and combinations thereof. Such additives may be readily soluble in, and provide refractive index matching with, the high molecular weight component. For example, an additive may have a refractive index measured at 652.9 nm of from approximately 1.38 to approximately 1.55. Such an oligomeric or polymeric low molecular weight additive may constitute from approximately 0.1 wt. % to approximately 90 wt. % of the polymer thin film, e.g., 0.1 wt. %, 0.2 wt. %, 0.5 wt. %, 1 wt. %, 2 wt. %, 5 wt. %, 10 wt. %, 20 wt. %, 30 wt. %, 40 wt. %, 50 wt. %, 60 wt. %, 70 wt. %, 80 wt. %, or 90 wt. %, including ranges between any of the foregoing values. In some embodiments, the low molecular weight additive may be crystallizable. In some embodiments, the low molecular weight additive may be co-crystallizable with the crystallizable polymer.

According to some embodiments, further example low molecular weight additives may include a lubricant. The addition of one or more lubricants may provide intermolecular interactions with PVDF-family member chains and a beneficially lower melt viscosity. Example lubricants may include metal soaps, hydrocarbon waxes, low molecular weight polyethylene, fluoropolymers, amide waxes, fatty acids, fatty alcohols, and esters.

Further example low molecular weight additives may include oligomers and polymers that may have polar interactions with PVDF-family member chains. Such oligomers and polymers may include ester, ether, hydroxyl, phosphate, fluorine, halogen, or nitrile groups. Particular examples include polymethylmethacrylate, polyethylene glycol, and polyvinyl acetate. PVDF polymer and PVDF oligomer-based additives, for example, may include a reactive group such as vinyl, acrylate, methacrylate, epoxy, isocyanate, hydroxyl, or amine, and the like. Such additives may be cured in situ, i.e., within a polymer thin film, by applying one or more of heat or light or reaction with a suitable catalyst.

Still further example polar additives may include ionic liquids, such as 1-octadecyl-3-methylimidazolium bromide, 1-butyl-3-methylimidazolium[$PF_6$], 1-butyl-3-methylimidazolium[$BF_4$], 1-butyl-3-methylimidazolium[$FeCl_4$] or [1-butyl-3-methylimidazolium[Cl]. According to some embodiments, the amount of an ionic liquid may range from approximately 1 to 15 wt. % of the anisotropic polymer thin film.

In some examples, the low molecular weight additive may include a nucleation additive. A nucleation additive may promote a higher crystalline content. Example nucleation additives include amides, such as 1,3,5-benzenetricarboxamide; N,N'-bis[2-(2-aminoethyl)octadecanoyl] decanediamide; 2-N,6-N-dicyclohexylnaphthalene-2,6-dicarboxamide, N-alkyl toluene sulfonamide, and the like.

In some examples, the low molecular weight additive may include an inorganic additive. An inorganic additive may increase the piezoelectric performance of the anisotropic polymer thin film. Example inorganic additives may include nanoparticles (e.g., ceramic nanoparticles such as PZT, BNT, or quartz; or metal or metal oxide nanoparticles), ferrite nanocomposites (e.g., $Fe_2O_3$—$CoFe_2O_4$), and hydrated salts or metal halides, such as LiCl, $Al(NO_3)_3$·$9H_2O$, $BiCl_3$, Ce or Y nitrate hexahydrate, or Mg chlorate hexahydrate. The amount of an inorganic additive may range from approximately 0.001 to 5 wt. % of the anisotropic polymer thin film.

Generally, the low molecular weight additive may constitute up to approximately 90 wt. % of the polymer thin film, e.g., approximately 0.001 wt. %, approximately 0.002 wt. %, approximately 0.005 wt. %, approximately 0.01 wt. %, approximately 0.02 wt. %, approximately 0.05 wt. %, approximately 0.1 wt. %, approximately 0.2 wt. %, approximately 0.5 wt. %, approximately 1 wt. %, approximately 2 wt. %, approximately 5 wt. %, approximately 10 wt. %, approximately 20 wt. %, approximately 30 wt. %, approximately 40 wt. %, approximately 50 wt. %, approximately 60 wt. %, approximately 70 wt. %, approximately 80 wt. %, or approximately 90 wt. %, including ranges between any of the foregoing values.

In some embodiments, one or more additives may be used. According to particular embodiments, an original additive can be used during processing of a thin film (e.g., during extrusion, casting, stretching, and/or poling). Thereafter, the original additive may be removed and replaced by a secondary additive. A secondary additive may be index matched to the crystalline polymer and may, for example, have a refractive index ranging from approximately 1.38 to approximately 1.46. A secondary additive can be added by soaking the thin film in a melting condition or in a solvent bath. A secondary additive may have a melting point of less than 100° C.

In some embodiments, an anisotropic polymer thin film may include an antioxidant. Example antioxidants include hindered phenols, phosphites, thiosynergists, hydroxylamines, and oligomer hindered amine light stabilizers (HALS).

After extrusion or casting, the PVDF film can be oriented either uniaxially or biaxially as a single layer or multilayer to form a piezoelectrically anisotropic film. An anisotropic polymer thin film may be formed using a thin film orientation system configured to heat and stretch a polymer thin film in at least one in-plane direction in one or more distinct regions thereof. In some embodiments, a thin film orientation system may be configured to stretch a polymer thin film, i.e., a crystallizable polymer thin film, along only one in-plane direction. For instance, a thin film orientation system may be configured to apply an in-plane stress to a polymer thin film along the x-direction while allowing the thin film to relax along an orthogonal in-plane direction (i.e., along the y-direction). As used herein, the relaxation of a polymer thin film may, in certain examples, accompany the absence of an applied stress along a relaxation direction.

According to some embodiments, within an example system, a polymer thin film may be heated and stretched transversely to a direction of film travel through the system. In such embodiments, a polymer thin film may be held along opposing edges by plural movable clips slidably disposed along a diverging track system such that the polymer thin film is stretched in a transverse direction (TD) as it moves along a machine direction (MD) through heating and deformation zones of the thin film orientation system. In some embodiments, the stretching rate in the transverse direction and the relaxation rate in the machine direction may be independently and locally controlled. In certain embodiments, large scale production may be enabled, for example, using a roll-to-roll manufacturing platform.

In certain aspects, the tensile stress may be applied uniformly or non-uniformly along a lengthwise or widthwise dimension of the polymer thin film. Heating of the polymer thin film may accompany the application of the tensile stress. For instance, a semi-crystalline polymer thin film may be heated to a temperature greater than room temperature (~23° C.) to facilitate deformation of the thin film and the formation and realignment of crystals and/or polymer chains therein.

The temperature of the polymer thin film may be maintained at a desired value or within a desired range before, during and/or after the act of stretching, i.e., within a pre-heating zone or a deformation zone downstream of the pre-heating zone, in order to improve the deformability of the polymer thin film relative to an un-heated polymer thin film. The temperature of the polymer thin film within a deformation zone may be less than, equal to, or greater than the temperature of the polymer thin film within a pre-heating zone.

In some embodiments, the polymer thin film may be heated to a constant temperature throughout the act of stretching. In some embodiments, a region of the polymer thin film may be heated to different temperatures, i.e., during and/or subsequent to the application of the tensile stress. In some embodiments, different regions of the polymer thin film may be heated to different temperatures. In certain embodiments, the strain realized in response to the applied tensile stress may be at least approximately 20%, e.g., approximately 20%, approximately 50%, approximately 100%, approximately 200%, approximately 400%, approximately 500%, approximately 1000%, approximately 2000%, approximately 3000%, or approximately 4000% or more, including ranges between any of the foregoing values.

In some embodiments, the crystalline content within the polymer thin film may increase during the act of stretching. In some embodiments, stretching may alter the orientation of crystals within a polymer thin film without substantially changing the crystalline content.

As used herein, the term "substantially" in reference to a given parameter, property, or condition may mean and include to a degree that one of ordinary skill in the art would understand that the given parameter, property, or condition is met with a small degree of variance, such as within acceptable manufacturing tolerances. By way of example, depending on the particular parameter, property, or condition that is substantially met, the parameter, property, or condition may be at least approximately 90% met, at least approximately 95% met, or even at least approximately 99% met.

Following deformation of the polymer thin film, the heating may be maintained for a predetermined amount of time, followed by cooling of the polymer thin film. The act of cooling may include allowing the polymer thin film to cool naturally, at a set cooling rate, or by quenching, such as by purging with a low temperature gas, which may thermally stabilize the polymer thin film.

Stretching a PVDF-family film may form both alfa and beta phase crystals, although only aligned beta phase crystals contribute to piezoelectric response. During and/or after a stretching process, an electric field may be applied to the polymer thin film. The application of an electric field (i.e., poling) may induce the formation and alignment of beta phase crystals within the film. Whereas a lower electric field (<50 V/micron) can be applied to align beta phase crystals, a higher electric field 50 V/micron) can be applied to both induce a phase transformation from the alpha phase to the beta phase and encourage alignment of the beta phase crystals.

In some embodiments, following stretching, the polymer thin film may be annealed. Annealing may be performed at a fixed or variable stretch ratio and/or a fixed or variable applied stress. An example annealing temperature may be greater than approximately 60° C., e.g., 80° C., 100° C., 120° C., 130° C., 140° C., 150° C., 160° C., 170° C., 180° C., or 190° C., including ranges between any of the foregoing values. The annealing process may include a single annealing step (e.g., a single temperature) or multiple steps (e.g., at multiple temperatures). Without wishing to be bound by theory, annealing may stabilize the orientation of polymer chains and decrease the propensity for shrinkage of the polymer thin film.

Following deformation, the crystals or chains may be at least partially aligned with the direction of the applied tensile stress. As such, a polymer thin film may exhibit a high degree of birefringence, a high degree of optical clarity, bulk haze of less than approximately 10%, a high piezoelectric coefficient, e.g., $d_{31}$ greater than approximately 5 pC/N and/or a high electromechanical coupling factor, e.g., $k_{31}$ greater than approximately 0.1.

In accordance with various embodiments, anisotropic polymer thin films may include fibrous, amorphous, partially crystalline, or wholly crystalline materials. Such materials may also be mechanically anisotropic, where one or more characteristics may include compressive strength, tensile strength, shear strength, yield strength, stiffness, hardness, toughness, ductility, machinability, thermal expansion, piezoelectric response, and creep behavior may be directionally dependent.

A polymer composition having a bimodal molecular weight may be formed into a single layer using extrusion and casting operations. Alternatively, a polymer composition having a bimodal molecular weight may be co-extruded with other polymers or other non-polymer materials to form a multilayer polymer thin film. The application of a uniaxial or biaxial stress to an extruded single or multilayer thin film may be used to align polymer chains and/or re-orient crystals to induce mechanical and piezoelectric anisotropy therein.

Aspects of the present disclosure thus relate to the formation of a single layer of a piezoelectrically anisotropic polymer thin film as well as a multilayer polymer thin film having improved mechanical and piezoelectric properties and including one or more anisotropic polymer thin films. The improved mechanical properties may include improved dimensional stability and improved compliance in conforming to a surface having compound curvature, such as a lens.

Features from any of the embodiments described herein may be used in combination with one another in accordance with the general principles described herein. These and other embodiments, features, and advantages will be more fully understood upon reading the following detailed description in conjunction with the accompanying drawings and claims.

The following will provide, with reference to FIGS. 1-5, a detailed description of polymer compositions suitable for forming anisotropic polymer thin films. The discussion associated with FIGS. 1-3 relates to example compositions having a bimodal molecular weight distribution. The discussion associated with FIGS. 4 and 5 relates to exemplary virtual reality and augmented reality devices that may include one or more anisotropic polymer materials as disclosed herein.

Figure 2:
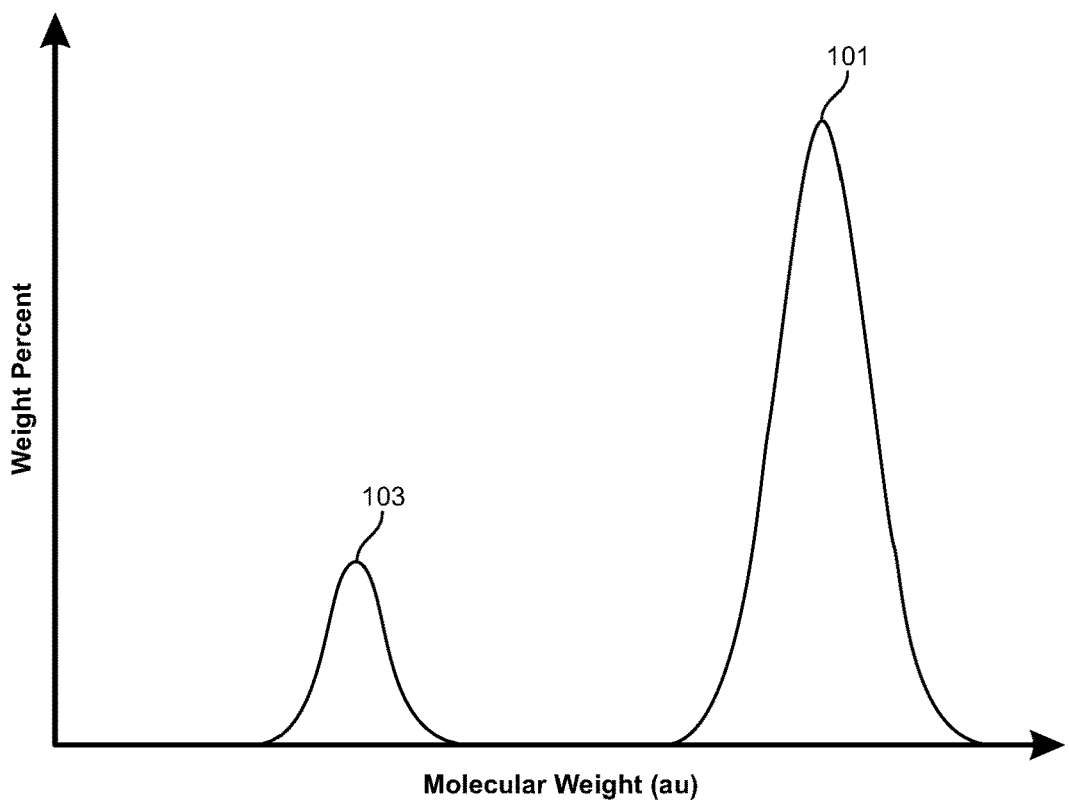
FIG. 2 is a plot showing the bimodal distribution of molecular weight among constituent elements of an example polymer thin film material according to further embodiments.
Figure 3:
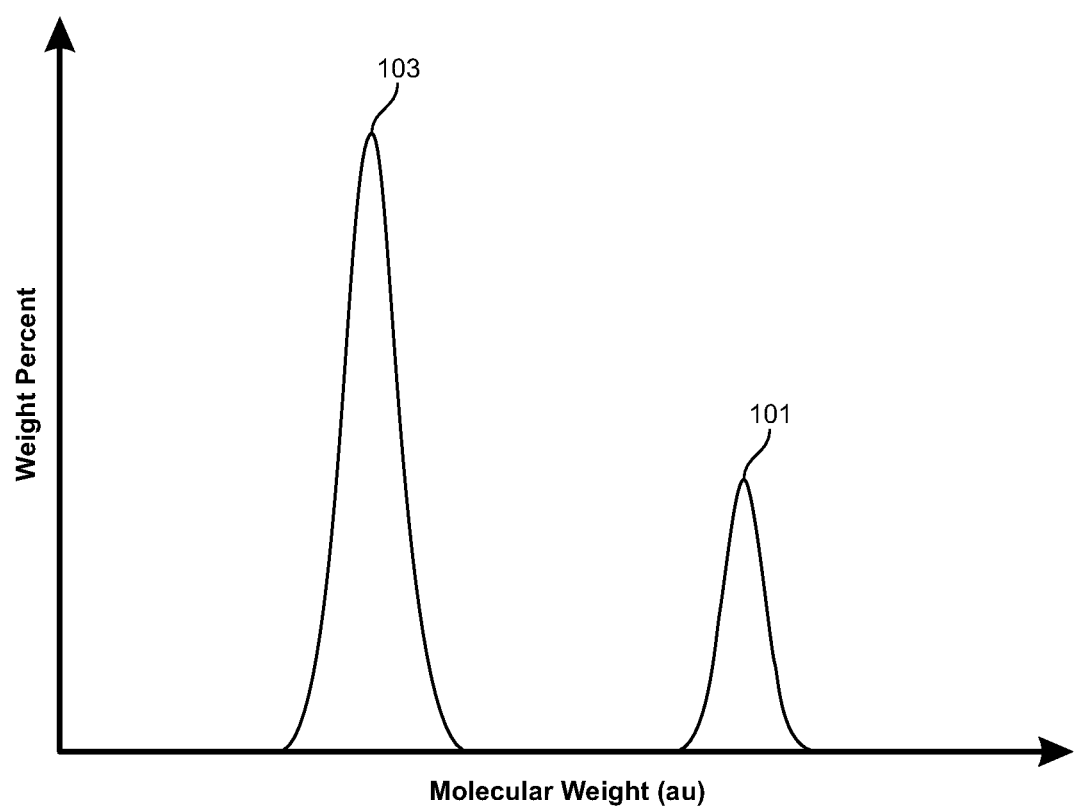
FIG. 3 is a plot showing the bimodal distribution of molecular weight among constituent elements of an example polymer thin film material according to still further embodiments.

Referring to FIG. 1, shown schematically is a composition having a bimodal molecular weight distribution that includes a crystallizable polymer 101 and a low molecular weight additive 102. Referring to FIG. 2, shown schematically is a further composition having a bimodal molecular weight distribution that includes a crystallizable polymer 101 and a low molecular weight additive 103. Referring to FIG. 3, shown schematically is a still further composition having a bimodal molecular weight distribution that includes a crystallizable polymer 101 and a low molecular weight additive 103.

In PVDF materials, a higher absolute beta ratio may lead to a higher piezoelectric coefficient ($d_{31}$) after electric poling. The effect of composition on crystalline content (e.g., beta phase content) was evaluated for low and high molecular weight PVDF homopolymer resins following thin film formation and stretching/annealing of the thin films. As used herein, Composition A corresponds to a low viscosity (low molecular weight) PVDF homopolymer resin, and Composition B corresponds to a high viscosity (high molecular weight) PVDF homopolymer resin. The resins were tested independently and as mixtures that may be characterized by a bimodal molecular weight distribution. The sample descriptions and crystallization data are summarized in Table 1.

TABLE 1

Effect of Composition on Crystallinity in PVDF Thin Films

| Sample | Composition (A/B) | Total Crystallinity (%) | Relative beta Ratio (%) | Absolute beta Ratio (%) |
|---|---|---|---|---|
| 1 | 100/0 | 81 | 82 | 66 |
| 2 | 70/30 | 84 | 90 | 76 |
| 3 | 60/40 | 84 | 92 | 77 |
| 4 | 50/50 | 69 | 90 | 62 |
| 5 | 0/100 | 70 | 91 | 64 |

The respective Compositions A and B (Samples 1 and 5) as well as mixtures thereof (Samples 2-4) were formed into thin films having a thickness of approximately 100 micrometers. The polymer thin films were than heated and stretched prior to measuring crystalline content. After heating the thin film samples to approximately 160° C., the thin films were stretched by applying a tensile stress that increased to a maximum of approximately 200 MPa. The thin films were drawn to a stretch ratio of approximately 9. Thereafter, while maintaining a constant applied stress (200 MPa), each thin film sample was annealed at approximately 160° C. for 20 min, heated at a ramp rate of 0.4° C./min to approximately 180° C. and annealed at approximately 180° C. for 30 min, and then heated at a ramp rate of 0.4° C./min to approximately 186° C. and annealed at approximately 186° C. for an additional 30 min. The samples were then cooled to below 35° C. under a constant applied stress 200 MPa stress, and then the stress was removed.

After cooling, total crystallinity was measured using differential scanning calorimetry (DSC), and the relative beta phase ratio was determined using Fourier Transform Infrared Spectroscopy (FTIR). The absolute beta crystallinity was calculated as the product of the total crystallinity and the relative beta ratio. The data indicate that the absolute beta phase content in the polymer thin films having a bimodal molecular weight distribution (Samples 2-4) may be greater than that in polymer thin films having a unimodal molecular weight distribution (Samples 1 and 5). In some embodiments, a polymer thin film may have an absolute beta ratio of at least approximately 50%, e.g., at least approximately 50%, at least approximately 60%, or at least approximately 70%, including ranges between any of the foregoing values.

According to a further embodiment where the polymer thin films (e.g., Samples 1-5) are heated and stretched prior to measuring crystalline content, after heating the thin film samples to 160° C.±10° C., the thin films may be stretched by applying a tensile stress that increased to a maximum of approximately 200 MPa. The thin films may be drawn to a stretch ratio of approximately 9. Thereafter, while maintaining a constant applied stress (200 MPa), each thin film sample may be annealed at 160° C.±10° C. for 20 min, heated at a ramp rate of 0.4° C./min to 180° C.±10° C. and annealed at 180° C.±10° C. for 30 min, and then heated at a ramp rate of 0.4° C./min to 186° C.±10° C. and annealed at 186° C.±10° C. for an additional 30 min. The samples may then be cooled to below 35° C. under a constant applied stress 200 MPa stress, and the stress removed.

According to some embodiments, a polymer thin film may include a crystalline polymer and a low (i.e., lower) molecular weight additive. The piezoelectric performance of PVDF and other PVDF-family polymer thin films may be determined by the amount of oriented beta phase crystal in the film. Beta phase crystals can be formed during the acts of film forming, stretching, or electric poling. Whereas the total crystallinity and the degree of crystalline alignment may be limited by conventional processing, e.g., due to chain entanglement, Applicants have shown that the addition of a low molecular weight additive to a thin film composition serves to decrease chain entanglement of the high molecular weight constituent, which increases the overall extent of beta phase crystallization as well as the alignment of beta phase crystals within the polymer thin film, e.g., during forming, stretching and/or poling operations.

Example Embodiments

Example 1: A polymer thin film includes a crystalline polymer and an additive, where the crystalline polymer has a molecular weight of at least approximately 100,000 g/mol, the additive has a molecular weight of less than approximately 25,000 g/mol, and the polymer thin film has an electromechanical coupling factor ($k_{31}$) of at least approximately 0.1.

Example 2: The polymer thin film of Example 1, where the crystalline polymer is preferentially oriented along a predetermined axis.

Example 3: The polymer thin film of any of Examples 1 and 2, where the crystalline polymer includes a moiety selected from vinylidene fluoride, trifluoroethylene, chlorotrifluoroethylene, hexafluoropropylene, vinyl fluoride, homopolymers thereof, co-polymers thereof, and tri-polymers thereof.

Example 4: The polymer thin film of any of Examples 1-3, where the additive includes a moiety selected from vinylidene fluoride, trifluoroethylene, chlorotrifluoroethylene, hexafluoropropylene, vinyl fluoride, homopolymers thereof, co-polymers thereof, and tri-polymers thereof.

Example 5: The polymer thin film of any of Examples 1-4, where the additive includes one or more of a lubricant, a nucleation agent, a piezoelectric ceramic, and a cation.

Example 6: The polymer thin film of any of Examples 1-5, where the additive contains a non-reactive moiety selected from an ester, ether, hydroxyl, phosphate, fluorine, halogen, and nitrile.

Example 7: The polymer thin film of any of Examples 1-6, where the additive is characterized by a refractive index ranging from approximately 1.38 to approximately 1.46.

Example 8: The polymer thin film of any of Examples 1-7, where the additive constitutes from approximately 0.1 wt. % to approximately 90 wt. % of the polymer thin film.

Example 9: The polymer thin film of any of Examples 1-8, where the polymer thin film is optically clear and is characterized by less than approximately 10% bulk haze.

Example 10: The polymer thin film of any of Examples 1-9, where the polymer thin film has a modulus greater than approximately 2 GPa.

Example 11: A method includes forming a polymer thin film by mixing a high molecular weight crystallizable polymer and a low molecular weight additive; and producing an in-plane strain in the polymer thin film along a first direction in an amount sufficient to re-orient crystals or align polymer chains within the polymer thin film and form an mechanically and piezoelectrically anisotropic polymer thin film, wherein the polymer thin film is characterized by a piezoelectric coefficient ($d_{31}$) of at least approximately 5 pC/N or an electromechanical coupling factor ($k_{31}$) of at least approximately 0.1.

Example 12: The method of Example 11, where forming the polymer thin film includes extruding or casting a mixture containing the high molecular weight crystallizable polymer and the low molecular weight additive.

Example 13: The method of any of Examples 11 and 12, where producing the in-plane strain includes applying a uniaxial stress to the polymer thin film.

Example 14: The method of any of Examples 11 and 12, where producing the in-plane strain includes applying a biaxial stress to the polymer thin film.

Example 15: The method of any of Examples 11-14, further including applying an electric field to the polymer thin film.

Example 16: The method of any of Examples 11-15, further including annealing the polymer thin film.

Example 17: A polymer thin film includes a crystalline polymer and an additive, where the crystalline polymer has a molecular weight of at least approximately 100,000 g/mol, the additive has a molecular weight of less than approximately 25,000 g/mol, and the polymer thin film has a piezoelectric coefficient ($d_{31}$) of at least approximately 5 pC/N.

Example 18: The polymer thin film of Example 17, where the crystalline polymer has a molecular weight of at least approximately 300,000 g/mol.

Example 19: The polymer thin film of any of Examples 17 and 18, where the additive has a molecular weight of less than approximately 4,000 g/mol.

Example 20: The polymer thin film of any of Examples 17-19, where the polymer thin film has an absolute beta ratio of at least approximately 50%.

Embodiments of the present disclosure may include or be implemented in conjunction with various types of artificial-reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely computer-generated content or computer-generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs). Other artificial-reality systems may include an NED that also provides visibility into the real world (such as, e.g., augmented-reality system 400 in FIG. 4) or that visually immerses a user in an artificial reality (such as, e.g., virtual-reality system 500 in FIG. 5). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 4:
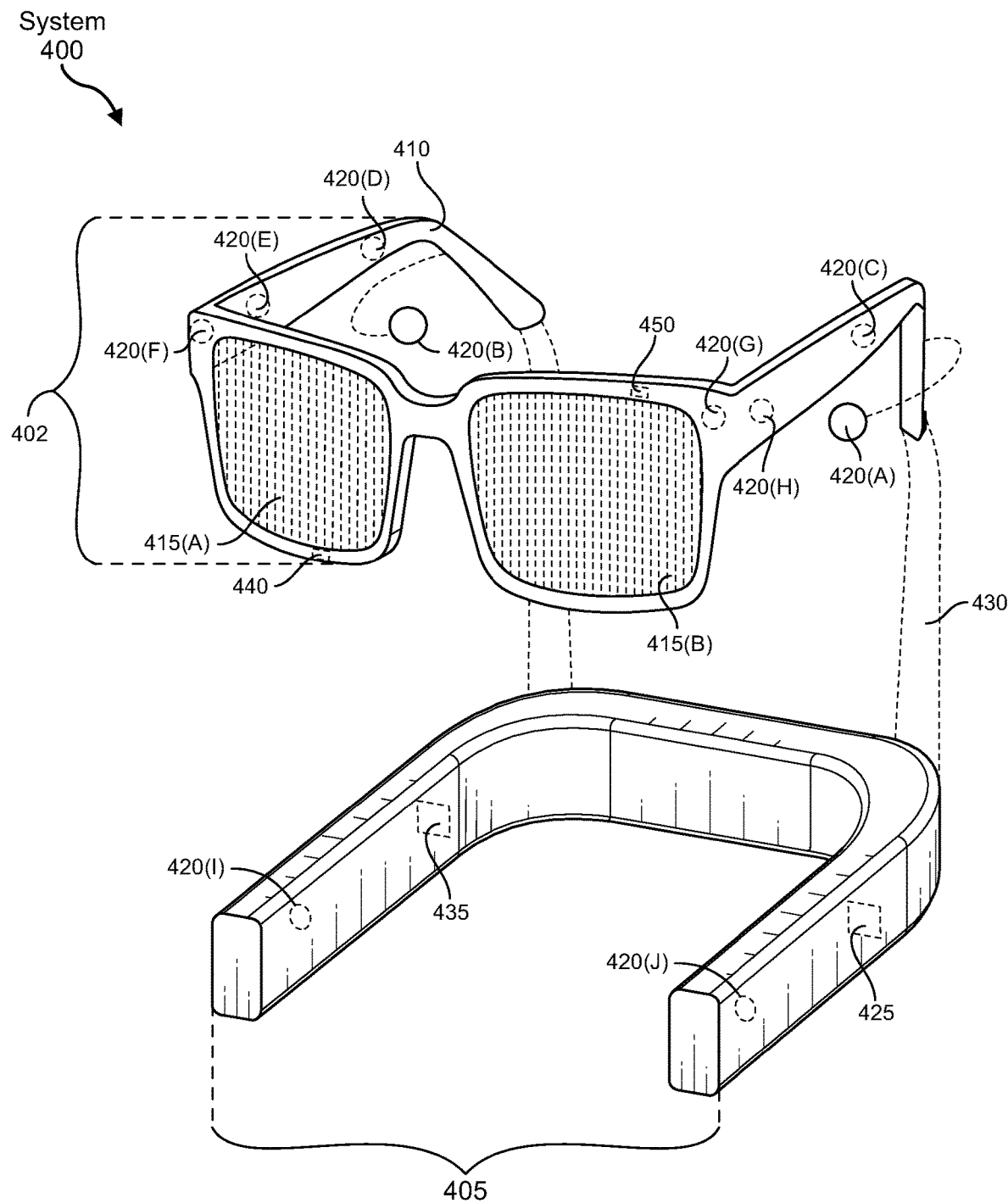
FIG. 4 is an illustration of exemplary augmented-reality glasses that may be used in connection with embodiments of this disclosure.
Figure 5:
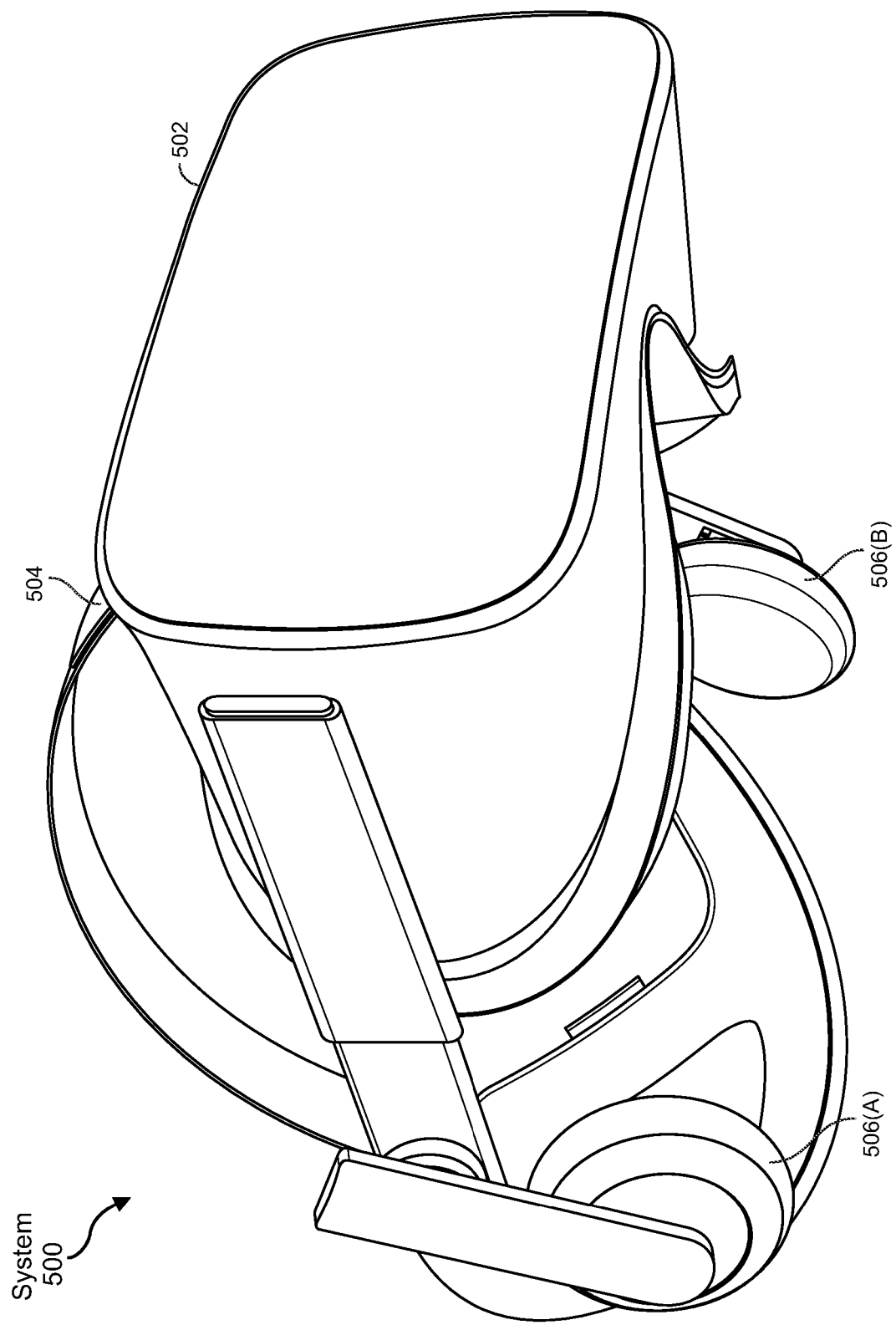
FIG. 5 is an illustration of an exemplary virtual-reality headset that may be used in connection with embodiments of this disclosure.

Turning to FIG. 4, augmented-reality system 400 may include an eyewear device 402 with a frame 410 configured to hold a left display device 415(A) and a right display device 415(B) in front of a user's eyes. Display devices 415(A) and 415(B) may act together or independently to present an image or series of images to a user. While augmented-reality system 400 includes two displays, embodiments of this disclosure may be implemented in augmented-reality systems with a single NED or more than two NEDs.

In some embodiments, augmented-reality system 400 may include one or more sensors, such as sensor 440. Sensor 440 may generate measurement signals in response to motion of augmented-reality system 400 and may be located on substantially any portion of frame 410. Sensor 440 may represent one or more of a variety of different sensing mechanisms, such as a position sensor, an inertial measurement unit (IMU), a depth camera assembly, a structured light emitter and/or detector, or any combination thereof. In some embodiments, augmented-reality system 400 may or may not include sensor 440 or may include more than one sensor. In embodiments in which sensor 440 includes an IMU, the IMU may generate calibration data based on measurement signals from sensor 440. Examples of sensor 440 may include, without limitation, accelerometers, gyroscopes, magnetometers, other suitable types of sensors that detect motion, sensors used for error correction of the IMU, or some combination thereof.

In some examples, augmented-reality system 400 may also include a microphone array with a plurality of acoustic transducers 420(A)-420(J), referred to collectively as acoustic transducers 420. Acoustic transducers 420 may represent transducers that detect air pressure variations induced by sound waves. Each acoustic transducer 420 may be configured to detect sound and convert the detected sound into an electronic format (e.g., an analog or digital format). The microphone array in FIG. 4 may include, for example, ten acoustic transducers: 420(A) and 420(B), which may be designed to be placed inside a corresponding ear of the user, acoustic transducers 420(C), 420(D), 420(E), 420(F), 420 (G), and 420(H), which may be positioned at various locations on frame 410, and/or acoustic transducers 420(I) and 420(J), which may be positioned on a corresponding neckband 405.

In some embodiments, one or more of acoustic transducers 420(A)-(J) may be used as output transducers (e.g., speakers). For example, acoustic transducers 420(A) and/or 420(B) may be earbuds or any other suitable type of headphone or speaker.

The configuration of acoustic transducers 420 of the microphone array may vary. While augmented-reality system 400 is shown in FIG. 4 as having ten acoustic transducers 420, the number of acoustic transducers 420 may be greater or less than ten. In some embodiments, using higher numbers of acoustic transducers 420 may increase the amount of audio information collected and/or the sensitivity and accuracy of the audio information. In contrast, using a lower number of acoustic transducers 420 may decrease the computing power required by an associated controller 450 to process the collected audio information. In addition, the position of each acoustic transducer 420 of the microphone array may vary. For example, the position of an acoustic transducer 420 may include a defined position on the user, a defined coordinate on frame 410, an orientation associated with each acoustic transducer 420, or some combination thereof.

Acoustic transducers 420(A) and 420(B) may be positioned on different parts of the user's ear, such as behind the pinna, behind the tragus, and/or within the auricle or fossa. Or, there may be additional acoustic transducers 420 on or surrounding the ear in addition to acoustic transducers 420 inside the ear canal. Having an acoustic transducer 420 positioned next to an ear canal of a user may enable the microphone array to collect information on how sounds arrive at the ear canal. By positioning at least two of acoustic transducers 420 on either side of a user's head (e.g., as binaural microphones), augmented-reality device 400 may simulate binaural hearing and capture a 3D stereo sound field around about a user's head. In some embodiments, acoustic transducers 420(A) and 420(B) may be connected to augmented-reality system 400 via a wired connection 430, and in other embodiments acoustic transducers 420(A) and 420(B) may be connected to augmented-reality system 400 via a wireless connection (e.g., a BLUETOOTH connection). In still other embodiments, acoustic transducers 420(A) and 420(B) may not be used at all in conjunction with augmented-reality system 400.

Acoustic transducers 420 on frame 410 may be positioned in a variety of different ways, including along the length of the temples, across the bridge, above or below display devices 415(A) and 415(B), or some combination thereof. Acoustic transducers 420 may also be oriented such that the microphone array is able to detect sounds in a wide range of directions surrounding the user wearing the augmented-reality system 400. In some embodiments, an optimization process may be performed during manufacturing of augmented-reality system 400 to determine relative positioning of each acoustic transducer 420 in the microphone array.

In some examples, augmented-reality system 400 may include or be connected to an external device (e.g., a paired device), such as neckband 405. Neckband 405 generally represents any type or form of paired device. Thus, the following discussion of neckband 405 may also apply to various other paired devices, such as charging cases, smart watches, smart phones, wrist bands, other wearable devices, hand-held controllers, tablet computers, laptop computers, other external compute devices, etc.

As shown, neckband 405 may be coupled to eyewear device 402 via one or more connectors. The connectors may be wired or wireless and may include electrical and/or non-electrical (e.g., structural) components. In some cases, eyewear device 402 and neckband 405 may operate independently without any wired or wireless connection between them. While FIG. 4 illustrates the components of eyewear device 402 and neckband 405 in example locations on eyewear device 402 and neckband 405, the components may be located elsewhere and/or distributed differently on eyewear device 402 and/or neckband 405. In some embodiments, the components of eyewear device 402 and neckband 405 may be located on one or more additional peripheral devices paired with eyewear device 402, neckband 405, or some combination thereof.

Pairing external devices, such as neckband 405, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 400 may be provided by a paired device or shared between a paired device and an eyewear device, thus reducing the weight, heat profile, and form factor of the eyewear device overall while still retaining desired functionality. For example, neckband 405 may allow components that would otherwise be included on an eyewear device to be included in neckband 405 since users may tolerate a heavier weight load on their shoulders than they would tolerate on their heads. Neckband 405 may also have a larger surface area over which to diffuse and disperse heat to the ambient environment. Thus, neckband 405 may allow for greater battery and computation capacity than might otherwise have been possible on a stand-alone eyewear device. Since weight carried in neckband 405 may be less invasive to a user than weight carried in eyewear device 402, a user may tolerate wearing a lighter eyewear device and carrying or wearing the paired device for greater lengths of time than a user would tolerate wearing a heavy standalone eyewear device, thereby enabling users to more fully incorporate artificial-reality environments into their day-to-day activities.

Neckband 405 may be communicatively coupled with eyewear device 402 and/or to other devices. These other devices may provide certain functions (e.g., tracking, localizing, depth mapping, processing, storage, etc.) to augmented-reality system 400. In the embodiment of FIG. 4, neckband 405 may include two acoustic transducers (e.g., 420(1) and 420(J)) that are part of the microphone array (or potentially form their own microphone subarray). Neckband 405 may also include a controller 425 and a power source 435.

Acoustic transducers 420(1) and 420(J) of neckband 405 may be configured to detect sound and convert the detected sound into an electronic format (analog or digital). In the embodiment of FIG. 4, acoustic transducers 420(1) and 420(J) may be positioned on neckband 405, thereby increasing the distance between the neckband acoustic transducers 420(1) and 420(J) and other acoustic transducers 420 positioned on eyewear device 402. In some cases, increasing the distance between acoustic transducers 420 of the microphone array may improve the accuracy of beamforming performed via the microphone array. For example, if a sound is detected by acoustic transducers 420(C) and 420(D) and the distance between acoustic transducers 420(C) and 420(D) is greater than, e.g., the distance between acoustic transducers 420(D) and 420(E), the determined source location of the detected sound may be more accurate than if the sound had been detected by acoustic transducers 420(D) and 420(E).

Controller 425 of neckband 405 may process information generated by the sensors on neckband 405 and/or augmented-reality system 400. For example, controller 425 may process information from the microphone array that describes sounds detected by the microphone array. For each detected sound, controller 425 may perform a direction-of-arrival (DOA) estimation to estimate a direction from which the detected sound arrived at the microphone array. As the microphone array detects sounds, controller 425 may populate an audio data set with the information. In embodiments in which augmented-reality system 400 includes an inertial measurement unit, controller 425 may compute all inertial and spatial calculations from the IMU located on eyewear device 402. A connector may convey information between augmented-reality system 400 and neckband 405 and between augmented-reality system 400 and controller 425. The information may be in the form of optical data, electrical data, wireless data, or any other transmittable data form. Moving the processing of information generated by augmented-reality system 400 to neckband 405 may reduce weight and heat in eyewear device 402, making it more comfortable to the user.

Power source 435 in neckband 405 may provide power to eyewear device 402 and/or to neckband 405. Power source 435 may include, without limitation, lithium ion batteries, lithium-polymer batteries, primary lithium batteries, alkaline batteries, or any other form of power storage. In some cases, power source 435 may be a wired power source. Including power source 435 on neckband 405 instead of on eyewear device 402 may help better distribute the weight and heat generated by power source 435.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 500 in FIG. 5, that mostly or completely covers a user's field of view. Virtual-reality system 500 may include a front rigid body 502 and a band 504 shaped to fit around a user's head. Virtual-reality system 500 may also include output audio transducers 506(A) and 506(B). Furthermore, while not shown in FIG. 5, front rigid body 502 may include one or more electronic elements, including one or more electronic displays, one or more inertial measurement units (IMUS), one or more tracking emitters or detectors, and/or any other suitable device or system for creating an artificial-reality experience.

Artificial-reality systems may include a variety of types of visual feedback mechanisms. For example, display devices in augmented-reality system 400 and/or virtual-reality system 500 may include one or more liquid crystal displays (LCDs), light emitting diode (LED) displays, microLED displays, organic LED (OLED) displays, digital light project (DLP) micro-displays, liquid crystal on silicon (LCoS) micro-displays, and/or any other suitable type of display screen. These artificial-reality systems may include a single display screen for both eyes or may provide a display screen for each eye, which may allow for additional flexibility for varifocal adjustments or for correcting a user's refractive error. Some of these artificial-reality systems may also include optical subsystems having one or more lenses (e.g., conventional concave or convex lenses, Fresnel lenses, adjustable liquid lenses, etc.) through which a user may view a display screen. These optical subsystems may serve a variety of purposes, including to collimate (e.g., make an object appear at a greater distance than its physical distance), to magnify (e.g., make an object appear larger than its actual size), and/or to relay (to, e.g., the viewer's eyes) light. These optical subsystems may be used in a non-pupil-forming architecture (such as a single lens configuration that directly collimates light but results in so-called pincushion distortion) and/or a pupil-forming architecture (such as a multi-lens configuration that produces so-called barrel distortion to nullify pincushion distortion).

In addition to or instead of using display screens, some of the artificial-reality systems described herein may include one or more projection systems. For example, display devices in augmented-reality system 400 and/or virtual-reality system 500 may include microLED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. The display devices may accomplish this using any of a variety of different optical components, including waveguide components (e.g., holographic, planar, diffractive, polarized, and/or reflective waveguide elements), light-manipulation surfaces and elements (such as diffractive, reflective, and refractive elements and gratings), coupling elements, etc. Artificial-reality systems may also be configured with any other suitable type or form of image projection system, such as retinal projectors used in virtual retina displays.

The artificial-reality systems described herein may also include various types of computer vision components and subsystems. For example, augmented-reality system 400 and/or virtual-reality system 500 may include one or more optical sensors, such as two-dimensional (2D) or 3D cameras, structured light transmitters and detectors, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

The artificial-reality systems described herein may also include one or more input and/or output audio transducers. Output audio transducers may include voice coil speakers, ribbon speakers, electrostatic speakers, piezoelectric speakers, bone conduction transducers, cartilage conduction transducers, tragus-vibration transducers, and/or any other suitable type or form of audio transducer. Similarly, input audio transducers may include condenser microphones, dynamic microphones, ribbon microphones, and/or any other type or form of input transducer. In some embodiments, a single transducer may be used for both audio input and audio output.

In some embodiments, the artificial-reality systems described herein may also include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visual aids, etc.). The embodiments disclosed herein may enable or enhance a user's artificial-reality experience in one or more of these contexts and environments and/or in other contexts and environments.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

It will be understood that when an element such as a layer or a region is referred to as being formed on, deposited on, or disposed "on" or "over" another element, it may be located directly on at least a portion of the other element, or one or more intervening elements may also be present. In contrast, when an element is referred to as being "directly on" or "directly over" another element, it may be located on at least a portion of the other element, with no intervening elements present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a polymer thin film that comprises or includes polyvinylidene fluoride include embodiments where a polymer thin film consists essentially of polyvinylidene fluoride and embodiments where a polymer thin film consists of polyvinylidene fluoride.

What is claimed is:

1. A polymer thin film, comprising:
a crystalline polymer; and
an additive, wherein the crystalline polymer has a weight average molecular weight of at least approximately 100,000 g/mol, the additive comprises a moiety derived from a monomer selected from the group consisting of vinylidene fluoride, trifluoroethylene, chlorotrifluoroethylene, hexafluoropropylene, and vinyl fluoride and has a weight average molecular weight of less than approximately 25,000 g/mol, and the polymer thin film has an electromechanical coupling factor ($k_{31}$) of at least approximately 0.1.

2. The polymer thin film of claim 1, wherein the crystalline polymer is oriented along a predetermined axis.

3. The polymer thin film of claim 1, wherein the crystalline polymer comprises a moiety derived from a monomer selected from the group consisting of vinylidene fluoride, trifluoroethylene, chlorotrifluoroethylene, hexafluoropropylene, and vinyl fluoride.

4. The polymer thin film of claim 1, wherein the additive comprises one or more of a lubricant, a nucleation agent, and a piezoelectric ceramic.

5. The polymer thin film of claim 1, wherein the additive contains a non-reactive moiety selected from the group consisting of an ester, ether, hydroxyl, phosphate, fluorine, halogen, and nitrile.

6. The polymer thin film of claim 1, wherein the additive is characterized by a refractive index ranging from approximately 1.38 to approximately 1.46.

7. The polymer thin film of claim 1, wherein the additive comprises from approximately 0.1 to approximately 90 weight percent of the polymer thin film.

8. The polymer thin film of claim 1, wherein the polymer thin film has a thickness ranging from approximately 100 nm to approximately 5 mm and a transmissivity within the visible light spectrum of at least approximately 25%.

9. The polymer thin film of claim 1, wherein the polymer thin film has a piezoelectric coefficient ($d_{31}$) of at least approximately 5 pC/N.

10. A polymer thin film, comprising:
a crystalline polymer; and
an additive, wherein the crystalline polymer has a weight average molecular weight of at least approximately 100,000 g/mol, the additive has a weight average molecular weight of less than approximately 25,000 g/mol and comprises a moiety derived from a monomer selected from the group consisting of vinylidene fluoride, trifluoroethylene, chlorotrifluoroethylene, hexafluoropropylene, and vinyl fluoride, and the polymer thin film has a piezoelectric coefficient ($d_{31}$) of at least approximately 5 pC/N.

11. The polymer thin film of claim 10, wherein the crystalline polymer has a weight average molecular weight of at least approximately 300,000 g/mol.

12. The polymer thin film of claim 10, wherein the additive has a weight average molecular weight of less than approximately 4,000 g/mol.

13. The polymer thin film of claim 10, wherein the polymer thin film has an absolute beta ratio of at least approximately 50%.

14. A method comprising:
forming a polymer thin film by mixing a high molecular weight crystallizable polymer having a weight average molecular weight of at least approximately 100,000 g/mol and a low molecular weight additive having a weight average molecular weight of less than approximately 25,000 g/mol; and
producing an in-plane strain in the polymer thin film along a first direction in an amount sufficient to re-orient crystals or align polymer chains within the polymer thin film and form a mechanically and piezoelectrically anisotropic polymer thin film, wherein the low molecular weight additive comprises a moiety derived from a monomer selected from the group consisting of vinylidene fluoride, trifluoroethylene, chlorotrifluoroethylene, hexafluoropropylene, vinyl fluoride, homopolymers thereof, co-polymers thereof, and tri-polymers thereof and the polymer thin film is characterized by a piezoelectric coefficient ($d_{31}$) of at least approximately 5 pC/N or an electromechanical coupling factor ($k_{31}$) of at least approximately 0.1.

15. The method of claim 14, wherein forming the polymer thin film comprises extruding or casting a mixture containing the high molecular weight crystallizable polymer and the low molecular weight additive.

16. The method of claim 14, wherein producing the in-plane strain comprises applying a uniaxial stress to the polymer thin film.

17. The method of claim 14, wherein producing the in-plane strain comprises applying a biaxial stress to the polymer thin film.

18. The method of claim 14, further comprising applying an electric field to the polymer thin film.

19. The method of claim 14, further comprising annealing the polymer thin film.

* * * * *